(12) United States Patent
Fang et al.

(10) Patent No.: US 8,071,407 B2
(45) Date of Patent: Dec. 6, 2011

(54) ACTIVE DEVICE ARRAY SUBSTRATE AND METHOD FOR FABRICATING THE SAME

(75) Inventors: Kuo-Lung Fang, Hsinchu (TW);
Hsiang-Lin Lin, Hsinchu (TW);
Han-Tu Lin, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 9 days.

(21) Appl. No.: 12/835,874

(22) Filed: Jul. 14, 2010

(65) Prior Publication Data
US 2010/0279450 A1 Nov. 4, 2010

Related U.S. Application Data

(62) Division of application No. 12/190,887, filed on Aug. 13, 2008, now Pat. No. 7,781,776.

(30) Foreign Application Priority Data

Apr. 11, 2008 (TW) .............................. 97113250 A

(51) Int. Cl.
*H01L 21/28* (2006.01)
(52) U.S. Cl. .............. 438/34; 257/59; 257/72; 257/88; 257/E27.11; 257/E29.146; 257/E29.151
(58) Field of Classification Search .............. 438/34; 257/59, 72, 88; 349/44.114
See application file for complete search history.

(56) References Cited

U.S. PATENT DOCUMENTS

| | | | |
|---|---|---|---|
| 6,791,651 B2 * | 9/2004 | Jo et al. ........................... | 349/141 |
| 6,862,070 B1 | 3/2005 | Sugimoto et al. | |
| 7,106,390 B2 | 9/2006 | Ha et al. | |
| 2002/0093599 A1 | 7/2002 | Ha et al. | |
| 2005/0019969 A1* | 1/2005 | Chang et al. ..................... | 438/30 |
| 2005/0041167 A1 | 2/2005 | Sugimoto et al. | |
| 2005/0078264 A1 | 4/2005 | Yoo et al. | |
| 2007/0090403 A1 | 4/2007 | Ahn et al. | |
| 2007/0170435 A1 | 7/2007 | Yoo et al. | |
| 2008/0079010 A1 | 4/2008 | Kim et al. | |
| 2009/0286386 A1* | 11/2009 | Lee et al. ......................... | 438/586 |

FOREIGN PATENT DOCUMENTS

TW 2005 16539 5/2005

OTHER PUBLICATIONS

Taiwan Office Action issued Sep. 28, 2011.

* cited by examiner

*Primary Examiner* — Ahmed Sefer
(74) *Attorney, Agent, or Firm* — Thomas, Kayden, Horstemeyer & Risley, LLP

(57) ABSTRACT

An active device array substrate and its fabricating method are provided. According to the subject invention, the elements of an array substrate such as the thin film transistors, gate lines, gate pads, data lines, data pads and storage electrodes, are provided by forming a patterned first metal layer, an insulating layer, a patterned semiconductor layer and a patterned metal multilayer. Furthermore, the subject invention uses the means of selectively etching certain layers. Using the aforesaid means, the array substrate of the subject invention has some layers with under-cut structures, and thus, the number of the time-consuming and complicated mask etching process involved in the production of an array substrate can be reduced. The subject invention provides a relatively simple and time-saving method for producing an array substrate.

15 Claims, 13 Drawing Sheets

ACTIVE DEVICE ARRAY SUBSTRATE AND METHOD FOR FABRICATING THE SAME

CROSS-REFERENCES TO RELATED APPLICATIONS

This application is a divisional of pending U.S. application Ser. No. 12/190,887 filed Aug. 13, 2008, which claims the benefit from the priority of Taiwan Patent Application No. 097113250 filed on Apr. 11, 2008, the disclosures of which are incorporated by reference herein in their entirety.

BACKGROUND OF THE INVENTION

1. Field of the Invention

The present invention provides an active device array substrate and fabricating method thereof. In particular, a method for fabricating a thin film transistor array substrate, which can reduce the number of required mask processes, is provided.

2. Descriptions of the Related Art

Liquid crystal displays (LCDs) possess several advantages, such as high definition, small volume, light weight, low-voltage drive, low power consumption, a broad range of applications, etc. Thus, LCDs have been widely applied in consumer electronic products, such as portable televisions, mobile phones, notebooks, desktop displays and the like and have also become mainstream in display markets.

A general liquid crystal display, like a thin-film transistor liquid crystal display, is essentially composed of a thin film transistor array substrate, a color filter array substrate and a liquid crystal layer. A thin film transistor array substrate is composed of a plurality of thin film transistors arranged in arrays and a plurality of pixel electrodes corresponding to each of the thin film transistors. The individual pixel units therein are usually controlled by a gate line and a data line.

However, with the trend of device miniaturization, a flattening process is typically used to produce a thin film transistor array substrate to provide a better aperture ratio on a smaller substrate area, in the traditional flattening process for producing a thin film transistor array substrate, five to six photolithography (or so-called "mask") processes are usually necessary to produce the desired array substrate. Each of the photolithography processes includes the following steps: coating of a photoresist, the use of patterned masks, the exposure of the photoresist, the development of the photoresist, film etching, the removal of the residual photoresist, etc. These steps will be collectively referred to as the "mask process" hereafter.

When producing a thin film transistor active array substrate in prior art, the first mask process (where a binary mask is used) is firstly introduced to form a patterned first metal layer on the substrate, which serves as the gates, gate lines and gate pads. Secondly, the first insulating layer and semiconductor layer are deposited sequentially. A second mask process is then performed to define the patterned semiconductor layer on the first insulating layer above the gates. Subsequently, a second metal layer is further deposited and a third mask process is performed to pattern the second metal layer to form the sources/drains, storage electrodes, data lines and data pads. The second insulating layer is then deposited subsequently and a fourth mask process is applied to produce a plurality of openings with a suitable depth, which function as the contact windows for metals. Finally, a conducting layer is deposited thereon and a fifth mask process is utilized to pattern the conducting layer to form the pixel electrodes. The production of the thin film transistor array substrate is then completed herein. In some conventional methods, after the second metal layer is patterned, a protection layer may be additionally deposited before performing another mask process. Therefore, six mask processes are involved, as mentioned in U.S. Pat. No. 6,862,070 B1.

As aforementioned, at least five mask processes have to be adopted according to prior arts of producing array substrates. However, this producing method is highly complicated, and each mask pattern has to be aimed precisely. Particularly, with the trend of the devices miniaturization, the difficulty of a whole process will be higher if many times of the aim of patterns are involved therein. If the deviation of aim occurs in any single mask, the produced device will deviate from the original design, and the efficiency of the device will significantly decrease, thus causing the deterioration of yields and the increase of costs. Hence, to develop a novel technique, which can decrease the number of the use of masks and maintain the high performance of liquid crystal displays, is desperately required in industry.

On the basis of the aforesaid descriptions, the inventor of the present invention provides a method for producing an array substrate, which can still provide an array substrate with favorable performance on the premise of decreasing the number of masks to lower the costs.

SUMMARY OF THE INVENTION

The primary objective of this invention is to provide a method of fabricating an active device array substrate to lower the cost of producing an active device array substrate. First of all, a substrate is provided, and a patterned first metal layer is formed on the substrate. The patterned first metal layer includes a plurality of gate lines, a plurality of gates and a plurality of gate pads, and the gate lines are connected with the gates and the gate pads. Sequentially, the first insulating layer is formed on the substrate and the patterned first metal layer, and then a patterned semiconductor layer is formed on parts of the first insulating layer. Lastly, a patterned metal multilayer is formed on the first insulating layer and the patterned semiconductor layer, wherein the patterned metal multilayer includes a plurality of data lines, a plurality of drains, a plurality of storage electrodes, a plurality of sources and a plurality of data pads, and the data lines are connected with the sources and the data pads. The sources and the drains are above the gates, and each of the drains storage electrodes respectively have a drain opening and a storage electrode opening, wherein the drain openings and the storage electrode openings expose parts of the patterned semiconductor layer. Subsequently, a second insulating layer is formed, and the second insulating layer and the first insulating layer are patterned to expose parts of the drain openings, parts of the storage electrode openings, parts of the data lines, parts of the data pads, parts of the gate lines, and parts of the gate pads. Afterwards, an etching process is performed to selectively remove the exposed parts of the patterned metal multilayer. Eventually, a patterned conducting layer is formed, wherein the patterned conducting layer includes a plurality of pixel electrodes electrically connected to the drains individually.

In an embodiment of the fabricating method according to the present invention, the patterned semiconductor layer is formed on the first insulating layer corresponding to the top of the gates, on parts of the first insulating layer corresponding to the underside of the drains, and on parts of the first insulating layer corresponding to the underside of the storage electrodes.

In an embodiment of the fabricating method according to the present invention, the data lines and the data pads are formed on the first insulating layer, while the data lines intersect the gate lines.

In an embodiment of the fabricating method according to the present invention, the steps of forming the patterned semiconductor layer and forming the patterned metal multilayer comprise the following: forming a semiconductor layer on the first insulating layer, patterning the semiconductor layer to form the patterned semiconductor layer, forming a metal multilayer on the first insulating layer and the patterned semiconductor layer, and patterning the metal multilayer to form the patterned metal multilayer.

In an embodiment of the fabricating method according to the present invention, the steps of forming the patterned semiconductor layer and forming the patterned metal multilayer comprise the following steps: forming a semiconductor layer and a metal multilayer on the first insulating layer sequentially, and patterning the semiconductor layer and the metal multilayer by using a half-tone mask process, gray-tone mask process, or attenuated phase-shift mask process to form the patterned semiconductor layer and the patterned metal multilayer simultaneously.

In an embodiment of the fabricating method according to the present invention, each of the storage electrodes is individually connected to each of the pixel electrodes.

In an embodiment of the fabricating method according to the present invention, the patterned metal multilayer, comprising a second metal layer and a third metal layer from top to bottom, is formed.

In an embodiment of the fabricating method according to the present invention, the second metal layer is an aluminum layer, while the third metal layer is a titanium layer, a molybdenum layer, or an alloy layer thereof.

According to an embodiment of the fabricating method of the present invention, the etching process uses wet or dry etching to remove parts of the exposed second metal layer to form under-cut structures.

In an embodiment of the fabricating method according to the present invention, the patterned first metal layer, comprising an upper metal layer and a lower metal layer, is formed.

In an embodiment of the fabricating method according to the present invention, the upper metal layer is an aluminum layer, while the lower metal layer is a titanium layer, a molybdenum layer, or an alloy layer thereof.

In an embodiment of the fabricating method according to the present invention, the etching process uses wet or dry etching to remove parts of the exposed upper metal layer to form under-cut structures.

In an embodiment of the fabricating method according to the present invention, the positions of the storage electrodes partially overlap the positions of the gate lines as seen from top to bottom.

In an embodiment of the fabricating method according to the present invention, the patterned first metal layer further comprises a plurality of common lines and a plurality of common pads connected with the common lines. The positions of the storage electrodes partially overlap the positions of the common lines as seen from top to bottom.

Another objective of this invention is to provide an active array substrate. The active array substrate sequentially comprises a substrate, a patterned first metal layer, a patterned first insulating layer, a patterned semiconductor layer, a patterned metal multilayer, a patterned second insulating layer, and a patterned conducting layer from bottom to top. The corresponding positions of each layer and the devices included therein are substantially as aforementioned. The patterned first metal layer includes a plurality of gate lines, a plurality of gates and a plurality of gate pads, the gate lines are connected with the gates and the gate pads. The patterned metal multilayer includes a plurality of data lines, a plurality of drains, a plurality of storage electrodes, a plurality of drains and a plurality of data pads, and the data lines are connected with the sources and the data pads, and the sources and the drains are above the gates. Each of the drains and each of the storage electrodes respectively have a drain opening and a storage electrode opening, wherein the drain openings and the storage electrode openings expose parts of the patterned semiconductor layer. Besides, the patterned second insulating layer and the patterned first insulating layer expose parts of the drain openings, parts of the storage electrode openings, parts of the data lines, parts of the data pads, parts of the gate lines, and parts of the gate pads. Furthermore, the exposed patterned metal multilayer has under-cut structures. As for the patterned conducting layer, it includes a plurality of pixel electrodes electrically connected to the drains individually.

In an embodiment of the array substrate according to the present invention, the patterned semiconductor layer is on the first insulating layer corresponding to the top of the gates, on parts of the first insulating layer corresponding to the underside of the drains, and on parts of the first insulating layer corresponding to the underside of the storage electrodes.

In an embodiment of the array substrate according to the present invention, the data lines and the data pads are on the first insulating layer, and the data lines intersect the gate lines.

In an embodiment of the array substrate according to the present invention, the patterned metal multilayer comprises a second metal layer and a third metal layer from top to bottom, wherein the second metal layer is an aluminum layer and the third metal layer is a titanium layer, a molybdenum layer, or an alloy layer thereof.

In an embodiment of the array substrate according to the present invention, the second metal layer has under-cut structures.

In an embodiment of the array substrate according to the present invention, the patterned first metal layer comprises an upper metal layer and a lower metal layer, wherein the upper metal layer is an aluminum layer and the lower metal layer is a titanium layer, a molybdenum layer, or an alloy layer thereof.

In an embodiment of the array substrate according to the present invention, the upper metal layer has under-cut structures.

In an embodiment of the array substrate according to the present invention, the positions of the storage electrodes partially overlap the positions of the gate lines as seen from top to bottom.

In an embodiment of the array substrate according to the present invention, the patterned first metal layer further includes a plurality of common lines and a plurality of common pads connected with the common lines, wherein the positions of the storage electrodes partially overlap the positions of the common lines as seen from top to bottom.

With reference to the figures and the method described below, people skilled in the field of the invention can easily realize the basic spirit and other objectives of the subject invention and the technical means and preferred embodiments used thereby.

DESCRIPTION OF THE PREFERRED EMBODIMENT

Specifically, the present invention provides a method for fabricating an active device array substrate. This method is primarily used to form an array substrate with under-cut structures, particularly a thin film transistor array substrate. With such structures, the demands for reducing the number of masks and shortening the process time are met. Furthermore, the array substrate possesses the property of ultra high aperture (UHA).

Figure 6A:
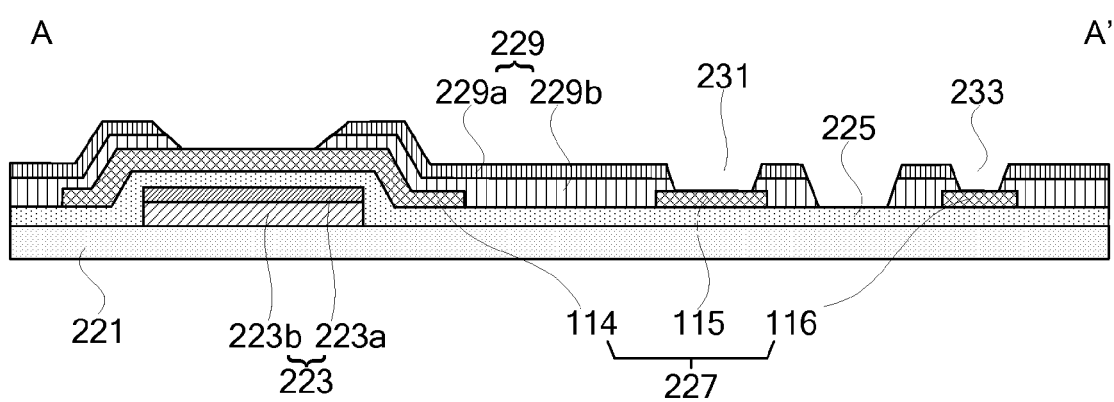
FIG. 6A to FIG. 6C are cross-sectional views along the cutting lines of A-A', B-B', and C-C' in FIG. 5, respectively.
Figure 6B:
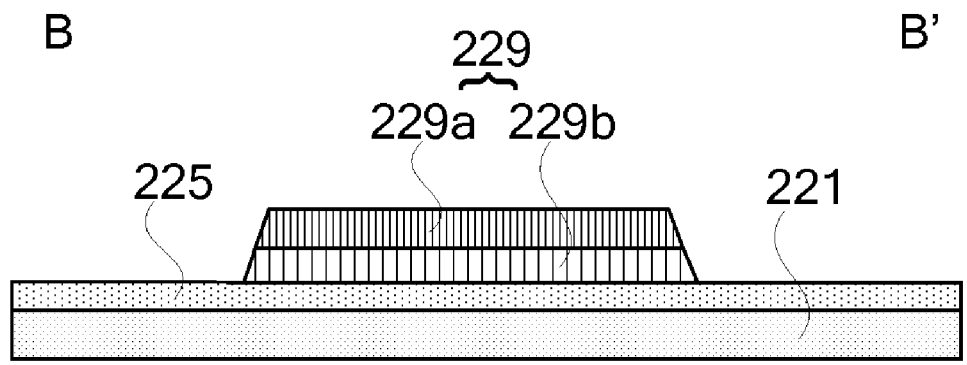
Figure 6C:
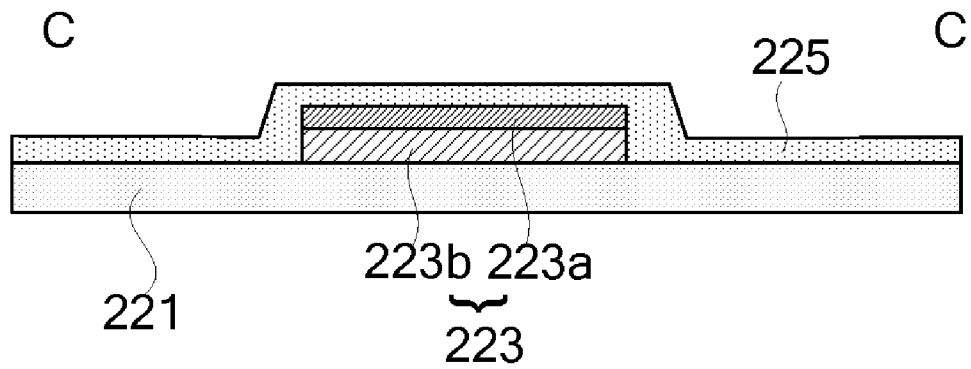
Figure 7:
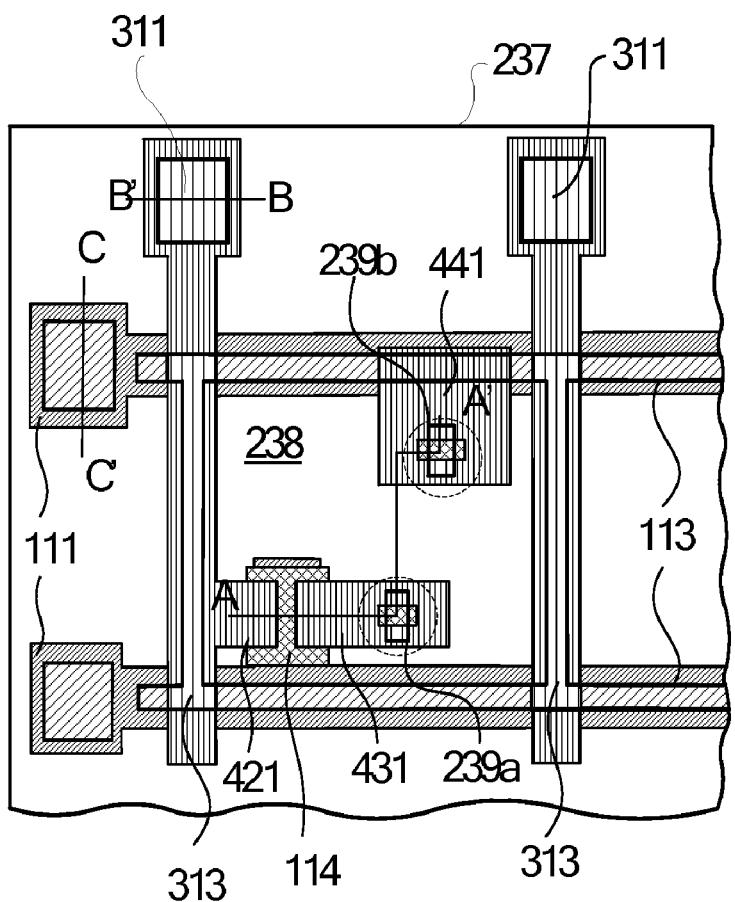
FIG. 7 is a top view of the active device array substrate after the fourth mask process in Embodiment 1 of the present invention.
Figure 12A:
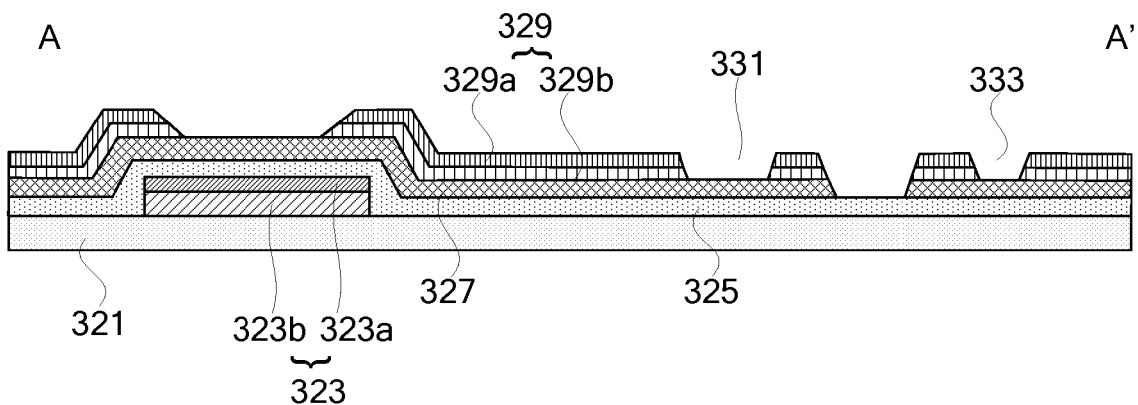
FIG. 12A to FIG. 12C are cross-sectional views along the cutting lines of A-A', B-B', and C-C' in FIG. 11, respectively.
Figure 12B:
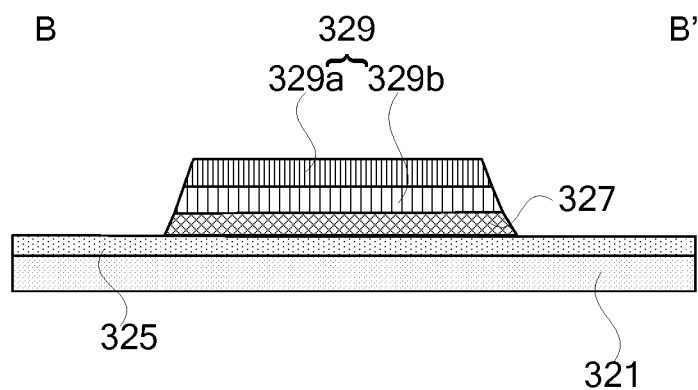
Figure 12C:
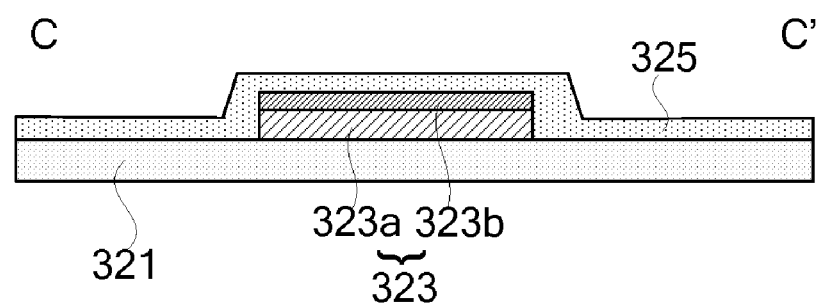
Figure 13:
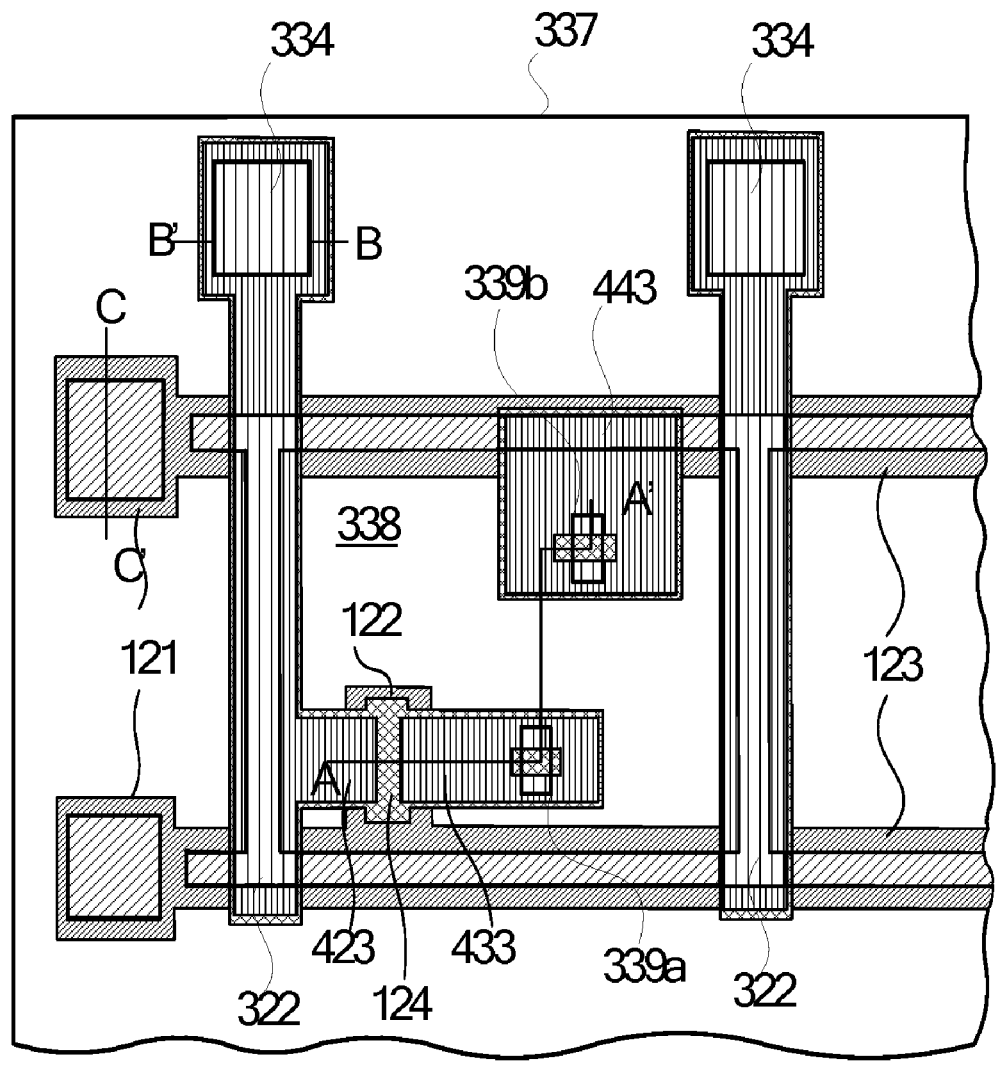
FIG. 13 is a top view of the active device array substrate after the third mask process in Embodiment 2 of the present invention.

To make the method for fabricating an active device array substrate of the present invention understandable, the top view perspective drawings, i.e. FIG. 7 and FIG. 13, are used to represent the active device array substrate of the present invention. The top and cross-sectional views are used to illustrate the embodiments of the present invention. Among which, FIG. 1, FIG. 3, FIG. 5, FIG. 9, and FIG. 11 show the top views of the active device array substrate in each step of the method according to the present invention. Each of the other figures is a cross-sectional view corresponding to the top view of the each step along the cutting lines of A-A', B-B', and C-C'. Concretely speaking, cutting line A-A' corresponds to FIG. 2A, FIG. 4A, FIG. 6A, FIG. 8A, FIG. 10A, FIG. 12A, and FIG. 14A; cutting line B-B' corresponds to FIG. 2B, FIG. 4B, FIG. 6B, FIG. 8B, FIG. 10B, FIG. 12B, and FIG. 14B; and cutting line C-C' corresponds to FIG. 2C, FIG. 4C, FIG. 6C, FIG. 8C, FIG. 10C, FIG. 12C, and FIG. 14C. Moreover, for simplification, the top views depict only one array block of the whole active device array substrate for illustration.

Embodiment 1

Step 1

Referring to FIG. 1 and FIGS. 2A to 2C, firstly, a patterned first metal layer 223 is formed on a substrate 221. According to the present invention, the substrate 221 is, for example, a glass substrate or a plastic substrate, while the patterned first metal layer 223 is a metal monolayer or a metal multilayer. In this embodiment, the patterned first metal layer 223 is composed of an upper metal layer 223a and a lower metal layer 223b, wherein the material of the upper metal layer 223a is, for example, aluminum, and the material of the lower metal layer 223b is, for example, titanium, molybdenum, or an alloy thereof.

Figure 1:
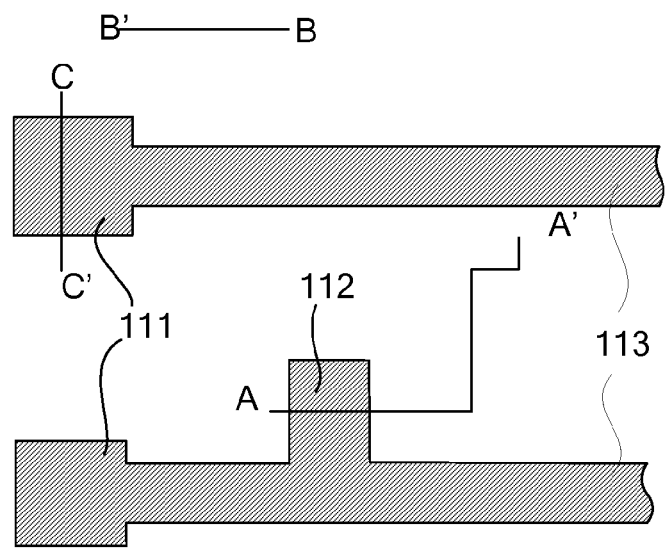
FIG. 1 is a top view of the active device array substrate after the first mask process in Embodiment 1 of the present invention.
Figure 2A:
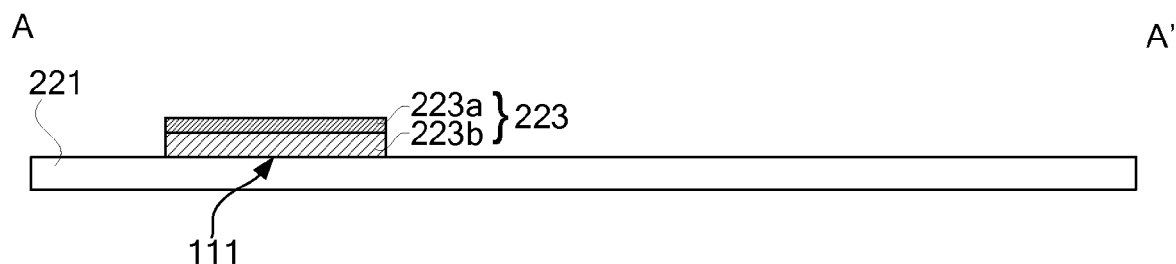
FIG. 2A to FIG. 2C are cross-sectional views along the cutting lines of A-A', B-B', and C-C' in FIG. 1, respectively.
Figure 2B:
Figure 2C:
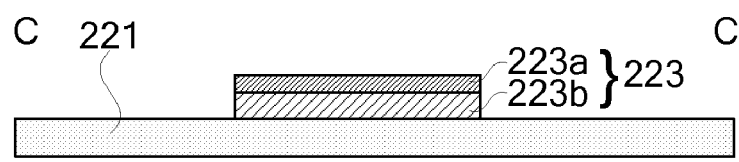

A chemical vapor deposition method, for instance, is adopted to deposit a first metal layer (not depicted), and then a binary mask, for example, is used to perform a first mask process to form the patterned first metal layer 223 (as shown in FIG. 1) on a predetermined position above the substrate 221, wherein the patterned first metal layer 223 includes a plurality of gate lines 113, a plurality of gate pads 111 and a plurality of gates 112, and the gate lines 113 are connected with the gate pads 111 and the gates 112.

Step 2

Figure 3:
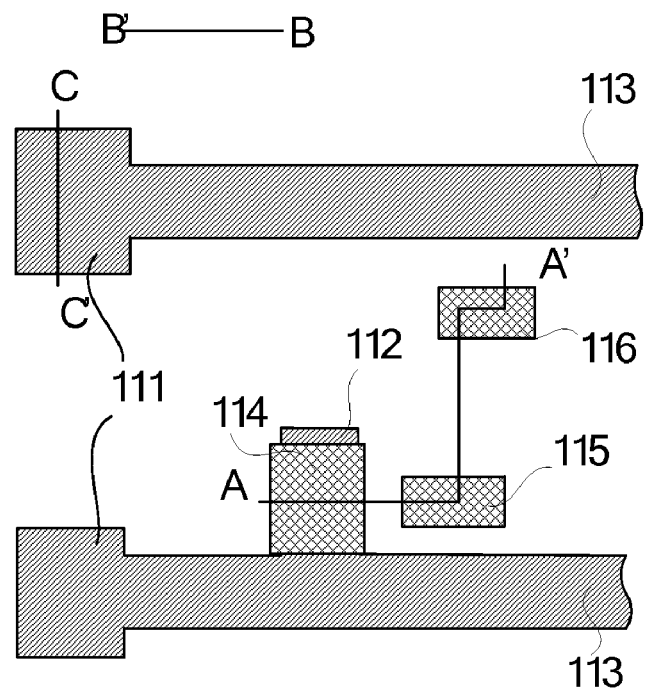
FIG. 3 is a top view of the active device array substrate after the second mask process in Embodiment 1 of the present invention.

Referring to FIG. 3 and FIGS. 4A to 4C, a first insulating layer 225 is formed to cover the substrate 221 and the patterned first metal layer 223 through a suitable deposition method, wherein the materials of the first insulating layer 225 are, for example, silicon oxide, silicon nitride, other dielectric materials, or combinations thereof. Then, a patterned semiconductor layer 227 is formed on parts of the first insulating layer 225. Herein, an amorphous silicon or poly-silicon semiconductor layer (not depicted), for instance, can be previously deposited on the first insulating layer 225, and then a second mask process is performed to form a patterned semiconductor layer 227 (as shown in FIG. 3) which covers a predetermined position. Herein, to clearly indicate the relative relationship between the layers, the top view in FIG. 3 (as well as FIGS. 5, 9, and 11) shows the array substrate under a presumption that the first insulating layer 225 is made of a transparent material. As a result, the first insulating layer 225 is not shown.

Figure 4A:
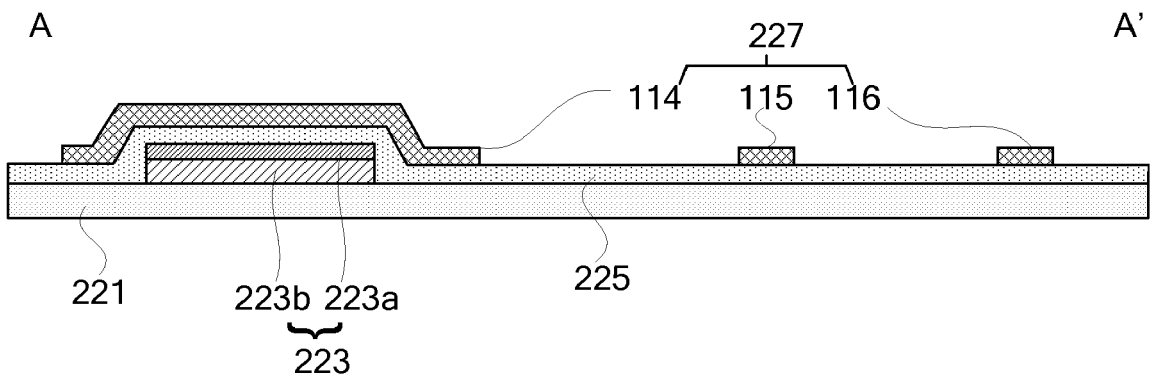
FIG. 4A to FIG. 4C are cross-sectional views along the cutting lines of A-A', B-B', and C-C' in FIG. 3, respectively.
Figure 4B:
Figure 4C:
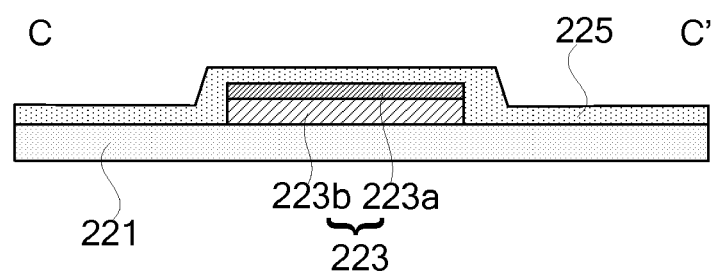

Concretely speaking, the patterned semiconductor layer 227 includes channel regions 114 above the gates 112 and etching stop regions 115 and 116 respectively on the first insulating layer 225 under the subsequently formed drains and on the first insulating layer 225 under the subsequently formed storage electrodes, as shown in FIG. 3 and FIG. 4A. The etching stop regions 115 and 116 can function as an etching stop layer in the subsequent mask processes and will be dilated later.

In addition, before the semiconductor layer is patterned, a contact layer (not depicted) can be selectively formed on the semiconductor layer, and then the second mask process is performed. The material of the contact layer is, for example, an n-doped amorphous silicon. The contact layer can improve the contact property between the patterned semiconductor layer 227 and the subsequently formed metal layer (e.g. the sources and the drains), and thereby improving the efficiency of the devices.

Step 3

Figure 5:
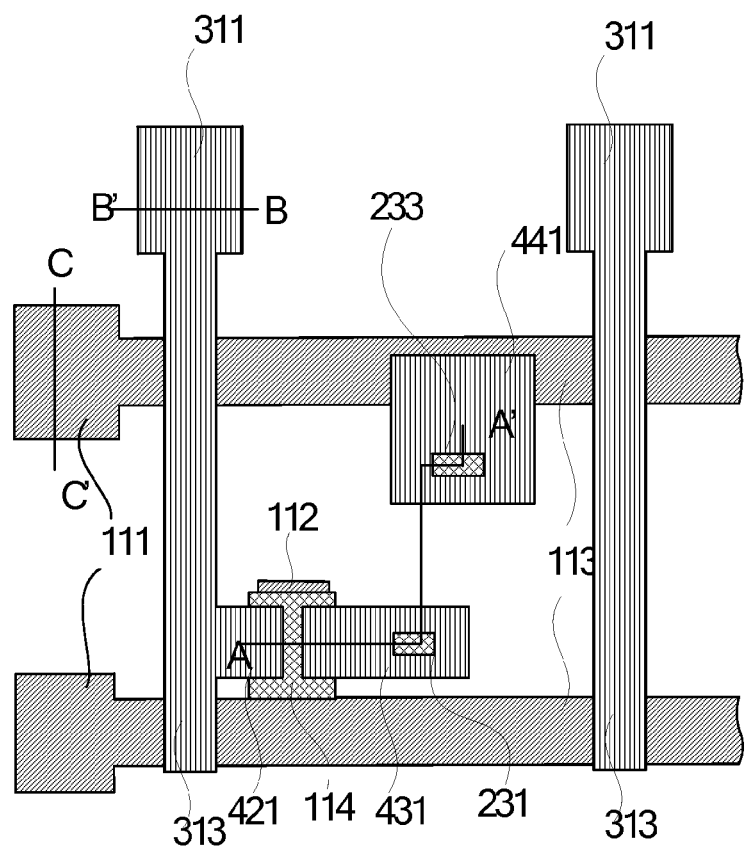
FIG. 5 is a top view of the active device array substrate after the third mask process in Embodiment 1 of the present invention.

As shown in FIG. 5 and FIGS. 6A to 6C, a patterned metal multilayer 229 is formed to expose parts of the patterned semiconductor layer 227. The patterned metal multilayer 229 is a multilayer comprising at least two metal layers. According to an embodiment of the present invention, as shown in FIG. 6A and FIG. 6B, the patterned metal multilayer 229 substantially includes a second metal layer 229a and a third metal layer 229b, wherein the material of the second metal layer 229a is, for example, aluminum, and the material of the third metal layer 229b is, for example, titanium, molybdenum, or an alloy thereof.

Step 3 can be carried out by firstly depositing a metal multilayer (not depicted) on the first insulating layer 225 and the patterned semiconductor layer 227, and then forming a patterned metal multilayer 229, which covers a pre-determined position through a third mask process and exposes parts of the patterned semiconductor layer 227, wherein the second metal layer 229a is shown in the top view drawing.

The mask process in Step 3 exposes parts of the channel regions 114 as well as parts of the etching stop regions 115 and 116, as shown in FIG. 5 and FIG. 6A. In another aspect, if Step 2 involves the formation of a contact layer on the semiconductor layer in advance, the exposed contact layer will be etched in the third mask process of Step 3 as well.

As shown in FIG. 5, the patterned metal multilayer 229 includes a plurality of data lines 313, a plurality of drains 431, a plurality of storage electrodes 441, a plurality of data pads 311 and a plurality of sources 421, and the data pads 311 and the sources 421 are connected with the data lines 313. The sources 421 and the drains 431 are above the gates 112 and the channel regions 114 and cover parts of the patterned semiconductor layer 227 to form a thin film transistor. The positions of the storage electrodes 441 partially overlap the positions of the gate lines 113 formed in Step 1 as seen from top to bottom along the stacking direction, as shown in FIG. 5. Specifically speaking, the storage electrodes 441 and the gate lines 113 beneath the storage electrodes 441 form a storage capacitor structure, and this structure facilitates an active device array substrate in a liquid crystal display for maintaining the stability of a display voltage, wherein the storage electrodes 441 serve as the upper electrodes of the capacitors. The data lines 313 and the data pads 311 of the patterned metal multilayer 229 are formed on the first insulating layer 225, while the data lines 313 intersect the gate lines 113.

Furthermore, through the mask process of this step, the drains 431 and the storage electrodes 441 respectively cover parts of the etching stop regions 115 and 116 in FIG. 3, and the drains 431 and the storage electrodes 441 respectively have openings which expose parts of the etching stop regions 115 and 116, i.e. drain openings 231 and storage electrode openings 233.

Step 4

Finally, referring to FIG. 7 and FIGS. 8A to 8C, a second insulating layer (not depicted) completely covering the substrate 221 is formed through a suitable deposition method. The second insulating layer and the first insulating layer 225 are then patterned. Among which, a fourth mask process can be performed in advance to form a patterned second insulating layer 235 and the patterned first insulating layer 225' to expose parts of the drain openings 231, parts of the storage electrode openings 233, parts of the data lines 313, parts of the data pads 311, parts of the gate lines 113, and parts of the gate pads 111 on the pre-determined positions. Depending on the requirements, the materials of the second insulating layer can be organic insulating materials, such as resin materials, or inorganic insulating materials, such as silicon oxide, silicon nitride, other dielectric materials, or combinations thereof.

As aforementioned, the etching stop regions 115 at the drain openings 231 and the etching stop regions 116 at the storage electrode openings 233 can function as the stop layer of film etching involved in the mask process of Step 4 to control the whole mask process more efficiently.

Subsequently, an etching process is performed. For instance, through a dry or wet etching method and utilizing the etching characteristics of different materials, parts of the exposed second metal layer 229a and parts of the exposed upper metal layer 223a are removed to form under-cut structures under the patterned second insulating layer 235 at the openings 239a, 239b, 239c, and 239d, as shown in the dashed line circles in FIG. 8A to FIG. 8C.

The patterned first metal layer 223 can be a single metal layer too. For example, it may be only composed of the lower metal layer 223b. After the fourth mask process of Step 4 is performed, the gate pads 111 and parts of the lower metal layer 223b of the gate lines 113 are exposed. Then, in the etching process, dry or wet etching, but not limited to, is used to laterally etch back the exposed patterned first insulating layer 225' to form the desired under-cut structures beneath the patterned second insulating layer 235 at these areas.

According to the method of the present invention, depending on needs, after Step 3 and prior to Step 4, a protective thin film (e.g. a silicon nitride layer) completely covering the substrate 221 can be deposited and then, a resin material is deposited as the second insulating layer and the fourth mask process is performed.

Finally, under the condition that the mask process is unnecessary, a patterned conducting layer 237 is formed directly, wherein the patterned conducting layer 237 includes pixel electrodes 238 electrically connected to the drains 431 and the storage electrodes 441. This step can be done by using a chemical vapor deposition method or physical vapor deposition method (e.g. sputtering deposition method) to deposit the patterned conducting layer 237 on the structure obtained in Step 4, thereby to complete the array substrate structure as shown in FIG. 7 and FIGS. 8A to 8C. Definitely speaking, since the obtained structure has under-cut structures under the patterned second insulating layer 235 at the openings 239a, 239b, 239c, and 239d, a desired electrical relationship (i.e. electrically connected or electrically insulated patterned conducting layer 237) of each device can be formed directly when the patterned conducting layer 237 is deposited. The materials of the patterned conducting layer 237 are conducting materials, such as indium tin oxide, indium zinc oxide, etc.

Figure 8A:
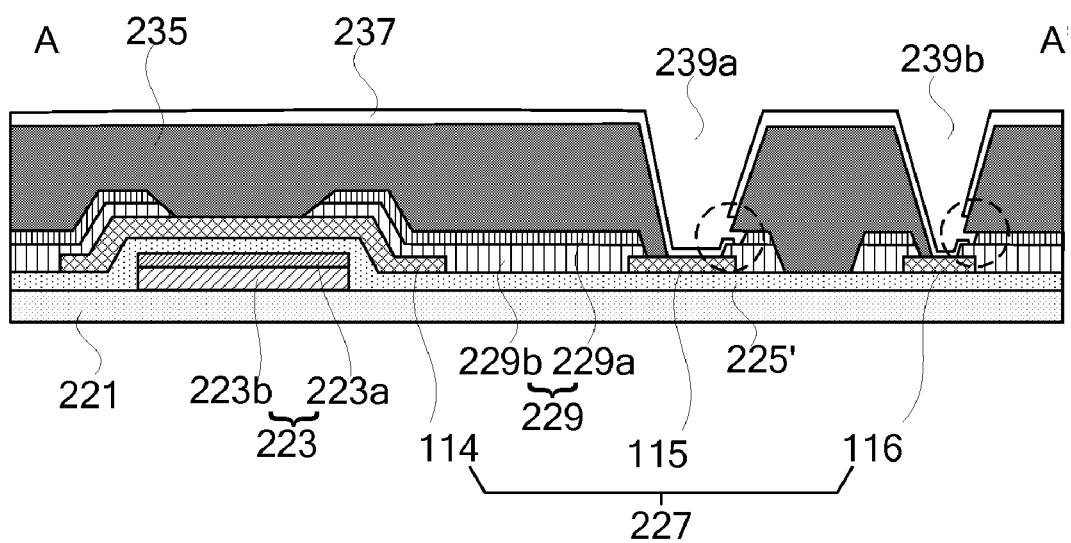
FIG. 8A to FIG. 8C are cross-sectional views along the cutting lines of A-A', B-B', and C-C' in FIG. 7, respectively.

Referring to FIG. 7 and FIG. 8A, a structure of the openings 239a and 239b can be seen in the dashed line circles in the figures, wherein the third metal layer 229b is exposed at two sides and the etching stop regions 115 or 116 is exposed in the central portion.

In addition, the method of the present invention can be carried out by another embodiment. Among which, Step 2 and Step 3 of Embodiment 1 are integrated, and a patterned semiconductor layer and a patterned metal multilayer are obtained through a single mask process. This embodiment is further illustrated with figures in the following.

Embodiment 2

Step 1

Figure 9:
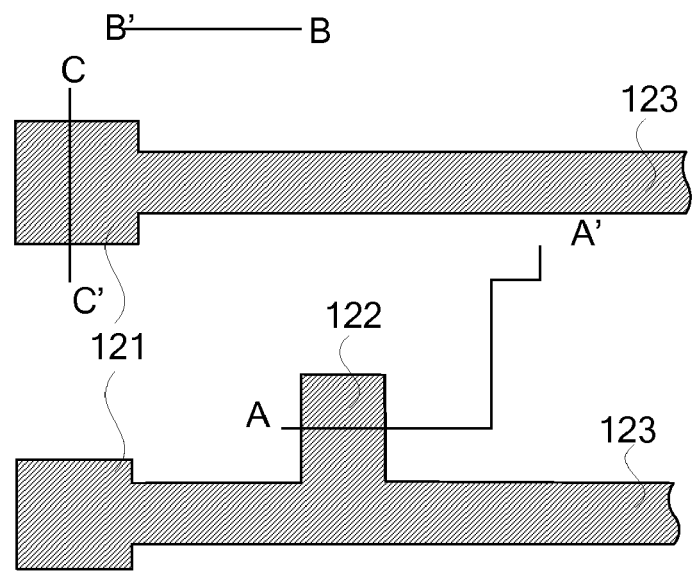
FIG. 9 is a top view of the active device array substrate after the first mask process in Embodiment 2 of the present invention.

Referring to FIG. 9 and FIGS. 10A to 10C, firstly, a first mask process is performed on a substrate 321 to form a patterned first metal layer 323 on a pre-determined position above the substrate 321, as shown in FIG. 9. This step, for example, can be done by adopting the same methods and materials of Step 1 in Embodiment 1. That is, a first metal layer (not depicted) is deposited in advance, and then a first mask process is performed to form a patterned first metal layer on the pre-determined position of the substrate 321.

Figure 10A:
FIG. 10A to FIG. 10C are cross-sectional views along the cutting lines of A-A', B-B', and C-C' in FIG. 9, respectively.
Figure 10B:
Figure 10C:
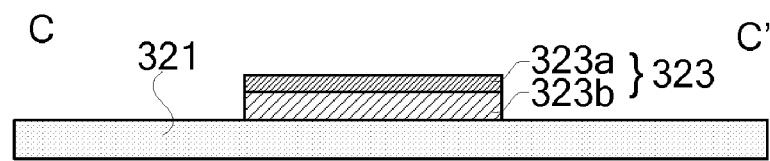

In this embodiment, the patterned first metal layer 323 is a metal multilayer, but not limited to. The patterned first metal layer 323 comprises an upper metal layer 323a and a lower metal layer 323b. As shown in FIG. 9, the patterned first metal layer 323 in this embodiment also includes a plurality of gate lines 123, a plurality of gates 122 and a plurality of gate pads 121, and the gate lines 123 are connected with the gates 122 and the gate pads 121. The cross-sectional views are shown in FIGS. 10A to 10C.

Step 2

Referring to FIG. 11 and FIGS. 12A to 12C, through the same deposition method as Embodiment 1, for example, a first insulating layer 325, a semiconductor layer (not depicted), and a metal multilayer (not depicted) are deposited sequentially, and the materials of each layer can be that illustrated in Embodiment 1.

Figure 11:
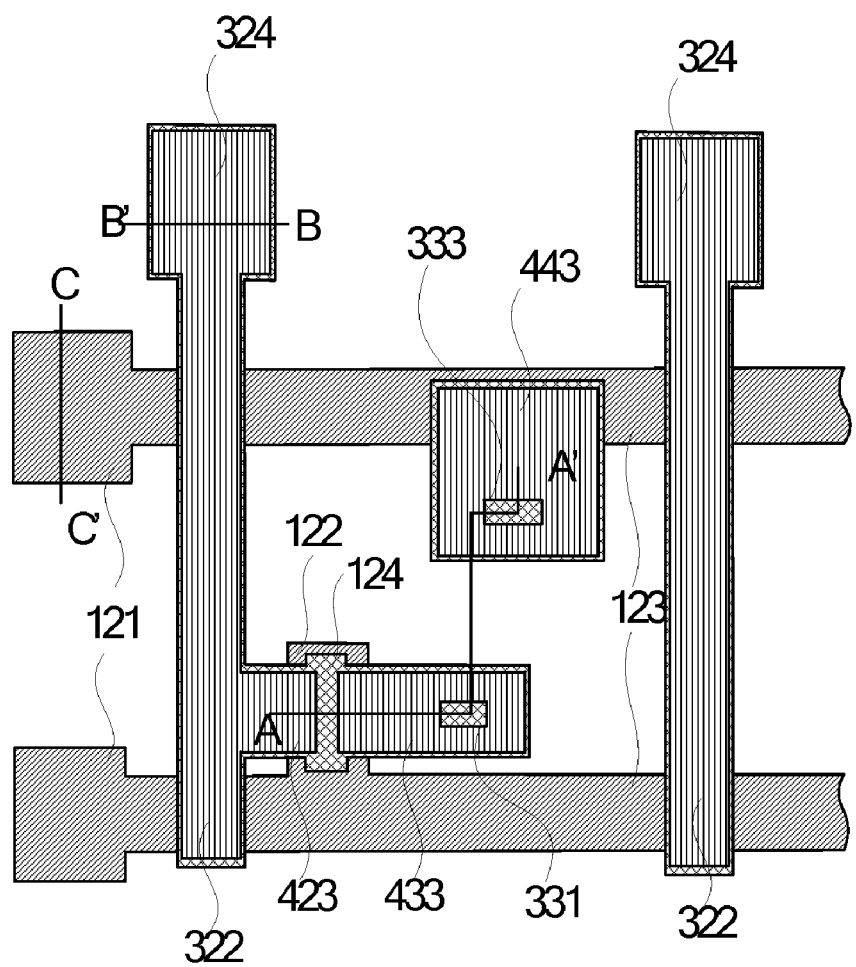
FIG. 11 is a top view of the active device array substrate after the second mask process in Embodiment 2 of the present invention.

Subsequently, a second mask process is performed by, for example, a gray-tone mask process, a half-tone mask process, or an attenuated phase-shift mask to pattern the semiconductor layer (not depicted) and the metal multilayer (not depicted), so that a patterned semiconductor layer 327 covering a pre-determined position above the substrate 321 and a patterned metal multilayer 329 covering a pre-determined position above the substrate 321 are formed. As shown in FIG. 11, the top view indicates a second metal layer 329a of the patterned metal multilayer 329, wherein the patterned semiconductor layer 327 covers an area which substantially corresponds to the underside of the patterned metal multilayer 329. Besides, as shown in FIG. 12A and FIG. 12B, the patterned metal multilayer 329 is composed of a second metal layer 329a and a third metal layer 329b. Similarly, the material of the second metal layer 329a, for example, can be aluminum, while the material of the third metal layer 329b, for example, can be titanium, molybdenum, or an alloy thereof.

The patterned metal multilayer 329 is above the patterned semiconductor layer 327, which exposes parts of the patterned semiconductor layer 327. As shown in FIG. 11, the patterned metal multilayer 329 also includes a plurality of data lines 322, a plurality of drains 433, a plurality of storage electrodes 443, a plurality of sources 423 and a plurality of data pads 324, and the data lines 332 are connected with the sources 423 and the data pads 324, as shown in Embodiment 1. The storage electrodes 443 and the gate lines 123 beneath the storage electrodes 443 form a storage electrode for stabilizing the voltage. The sources 423 and the drains 433 are above the gates 122 and the channel region 124, and are combined to form a thin film transistor. Moreover, the drains 433 and the storage electrodes 443 respectively have openings which expose parts of the patterned semiconductor layer 327, namely, drain openings 331 and storage electrode openings 333.

Step 3

Finally, the active device array substrate, as shown in FIG. 13 and FIG. 14A to FIG. 14C, is completed. This step can be done, for example, by repeating each procedure or each variation embodiment of Step 4 in Embodiment 1. That is, this step comprises the following components: forming a second insulating layer by deposition (not depicted) for example; forming a patterned second insulating layer 335 and a patterned first insulating layer 325' by using a third mask process; etching parts of the exposed second metal layer 329a and parts of the exposed upper metal layer 323a by dry or wet etching; and forming a patterned conducting layer 337 with a desired electrical connection, wherein the patterned conducting layer 337 includes pixel electrodes 338 electrically connected to the drains 433 and the storage electrodes 443 to complete the active device array substrate as shown in FIG. 13 and FIGS. 14A to 14C.

Figure 14A:
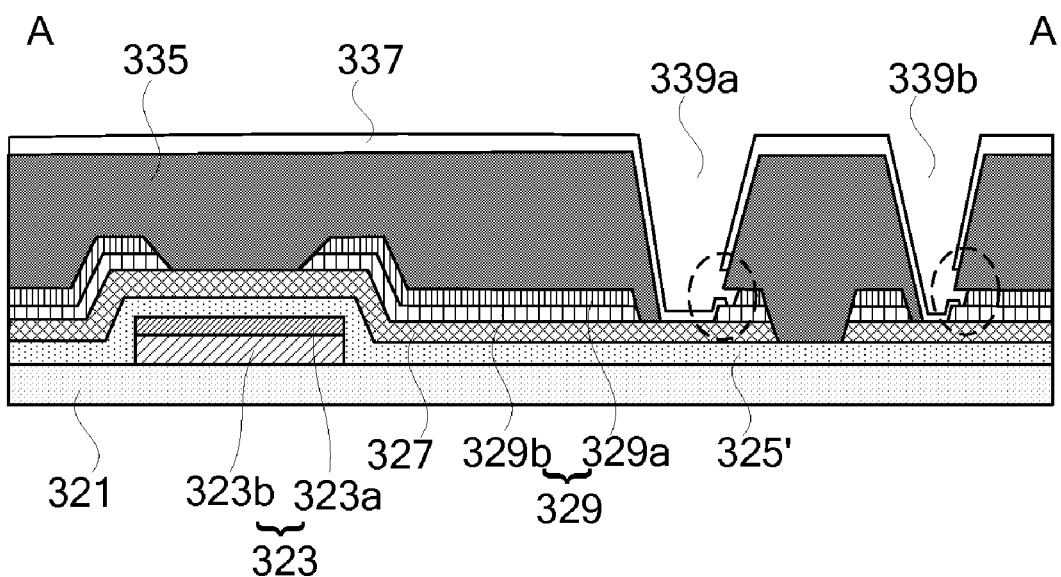
FIG. 14A to FIG. 14C are cross-sectional views along the cutting lines of A-A', B-B', and C-C' in FIG. 13, respectively.
Figure 14B:
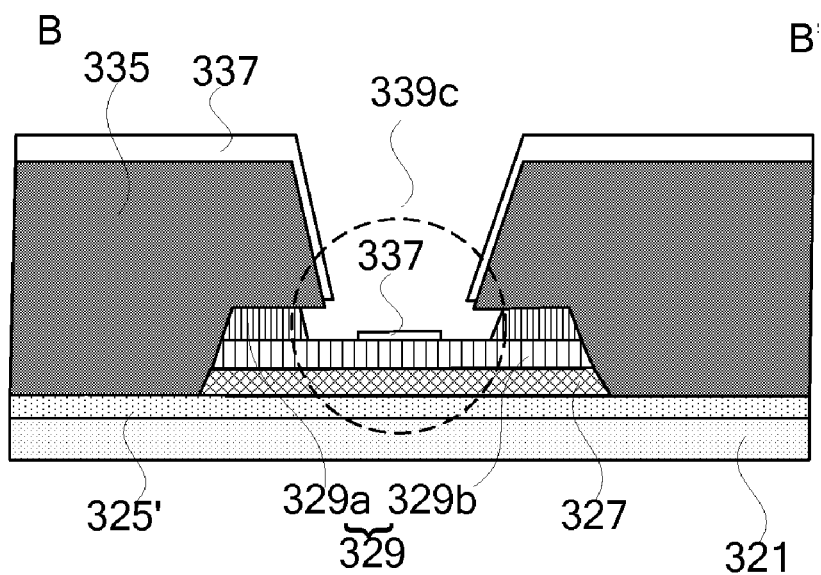
Figure 14C:
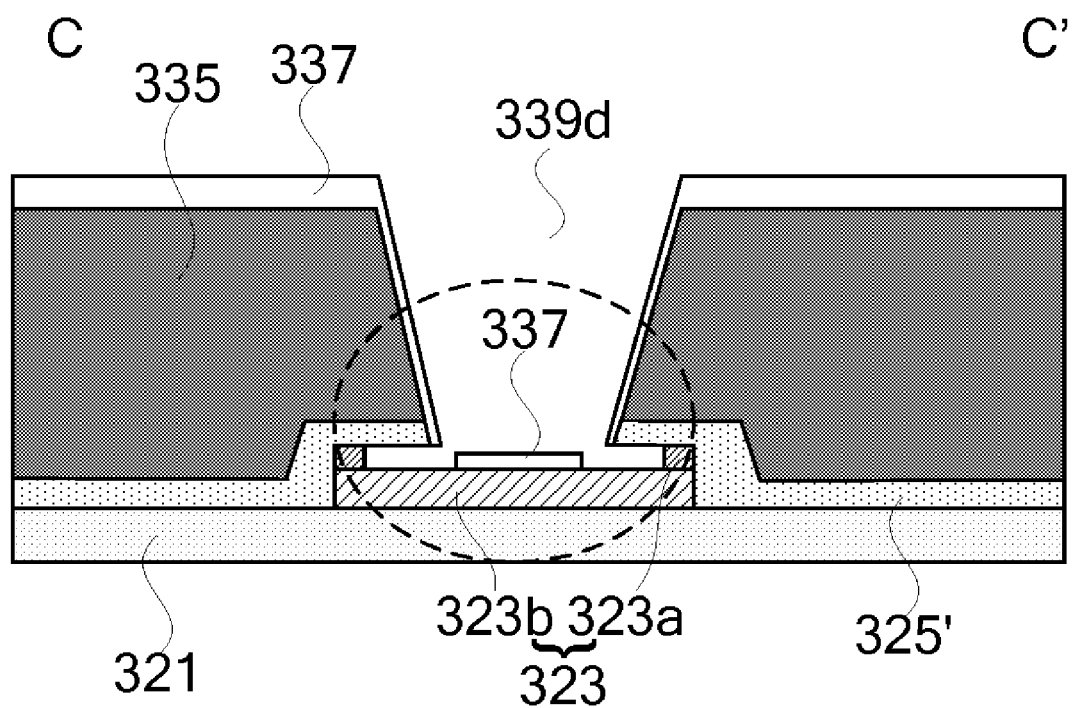

Also, in the etching step of Embodiment 2 of the present invention, under-cut structures are formed under the patterned second insulating layer 335 at openings 339a, 339b, 339c, and 339d, as shown in the dashed line circles in FIG. 14A to FIG. 14C. Thus, a desired electrical relationship (i.e. the patterned conducting layer 337 with electrical connection or electrical insulation) of each device can be formed directly without performing another patterning process (i.e. mask process), when subsequently depositing a transparent conducting material.

Since a half-tone mask process, for instance, is adopted in Embodiment 2, the four mask processes required in Embodiment 1 can be reduced to three mask processes. In addition, comparing FIG. 6A with FIG. 12A and comparing FIG. 6B with FIG. 12B, the active device array substrate obtained in Embodiment 2 has a continuous type of the patterned semiconductor layer 327 under the patterned metal multilayer 329 as the sources 423, the drains 433, the storage electrodes 443, the data lines 322, the data pads 324, etc, as shown in FIG. 11.

Given the above descriptions, since under-cut structures, as shown in the dashed line circles in FIGS. 8A to 8C and FIGS. 14A to 14C, are formed before the pixel electrodes 238 and 338 according to the method of the present invention, an additional mask process is not necessary to form the pixel electrodes 238 and 338, and thus the number of mask processes is reduced. Moreover, the number of complicated and time-consuming mask can be further decreased by using, for example, half-tone mask process as Embodiment 2, so that the efficiency of the whole process can be increased.

The present invention also provides an active device array substrate, the structure of which is shown in FIG. 7 and FIGS. 8A to 8C (i.e. Embodiment 1), or in FIG. 13 and FIGS. 14A to 14C (i.e. Embodiment 2).

Generally speaking, the active device array substrate of the present invention comprises a substrate 221, 321, a patterned first metal layer 223, 323, a patterned first insulating layer 225', 325', a patterned semiconductor layer 227, 327, a patterned metal multilayer 229, 329, a patterned second insulating layer 235, 335, and a patterned conducting layer 237, 337, from bottom to top. The materials of each layer, the devices included in each layer, the corresponding positions between each layer and each device, and the equal alterations are substantially as aforesaid and are not described herein.

Figure 8B:
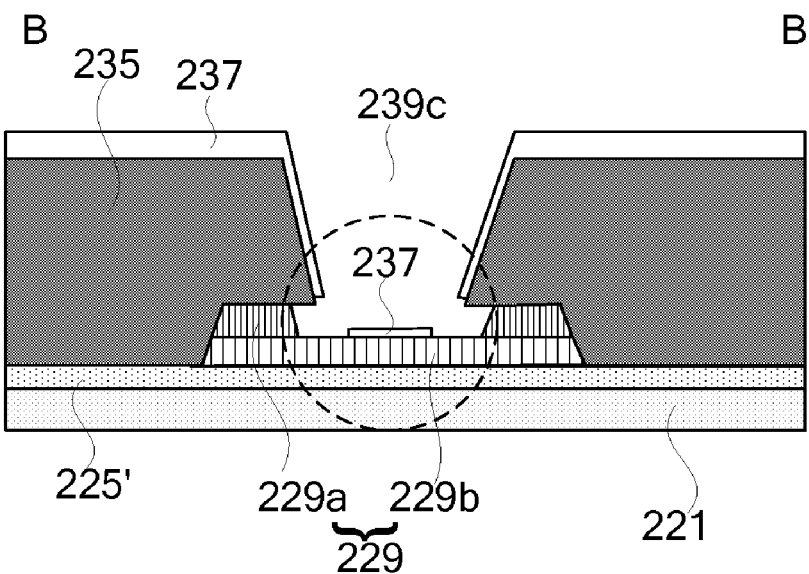
Figure 8C:
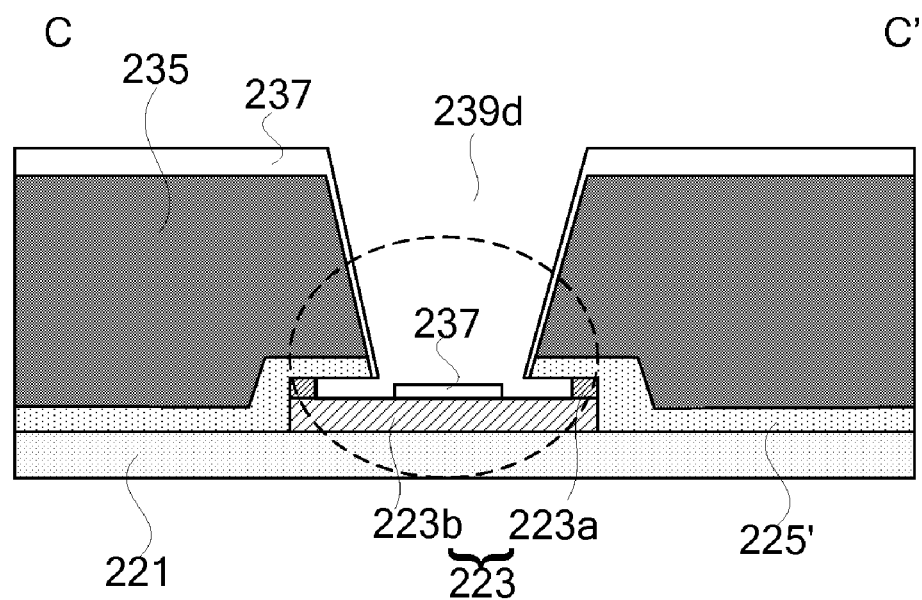

As shown in FIGS. 8A and 14A, the characteristics of the active device array substrate according to the present invention is that the second metal layer 229a, 329a of the patterned metal multilayer 229, 329 among the active device array substrate is provided with under-cut structures at the openings 239a, 239b, 339a, 339b, i.e. the inward apertures between the patterned second insulating layer 235, 335 and the third metal layer 229b, 329b. Besides, as shown in FIG. 8B and FIG. 14B, the second metal layer 229a, 329a is also provided with under-cut structures, and still as shown in FIG. 8C and FIG. 14C, the upper metal layer 223a, 323a also has under-cut structures. Because of such under-cut structures, the patterned conducting layer 237, 337 on the active device array substrate according to the present invention presents a desired electrical relationship, such as the electrical connection or electrical insulation.

Furthermore, in addition to the aforesaid active device array substrate where the storage electrodes are on the gate lines, an active device array substrate where the storage electrodes are on the common lines also can be provided, according to the present invention. The method of producing an active device array substrate where the storage electrodes are on a common line is substantially the same with the process and steps of the aforementioned Embodiment 1 or Embodiment 2. When forming a patterned first metal layer, parts of the patterned first metal layer are also defined as the plurality of common lines and a plurality of common pads connected with the common lines.

In addition, the storage electrodes can be formed on the common line, not on the gate lines. That is, besides gate lines, gate pads and the gates, the patterned first metal layer further includes the common lines and common pads connected with the common lines, namely, the gate lines, the gate pads, the gates, the common lines, and the common pads are formed simultaneously. As shown in FIG. 7, a common line is set parallel between the two gate lines 113. The storage electrodes 441, previously partially overlapping the gate lines 113 as seen from top to bottom, are changed to partially overlap the positions of common lines as seen from top to bottom. In addition to forming the common lines and common pads additionally and changing the positions of the storage electrodes, the other processes are substantially similar to the aforesaid embodiments and are not described herein.

The above disclosure is related to the detailed technical contents of this invention and the inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of fabricating an active device array substrate, comprising:
    providing a substrate;
    forming a patterned first metal layer on the substrate, wherein the patterned first metal layer includes a plurality of gate lines, a plurality of gates and a plurality of gate pads, and the gate lines are connected with the gates and the gate pads;
    forming a first insulating layer on the substrate and the patterned first metal layer;
    forming a patterned semiconductor layer on parts of the first insulating layer;
    forming a patterned metal multilayer on the first insulating layer and the patterned semiconductor layer, wherein the patterned metal multilayer includes a plurality of data lines, a plurality of drains, a plurality of storage electrodes, a plurality of sources and a plurality of data pads, and the data lines are connected with the sources and the data pads, and wherein the sources and the drains are respectively configured above the gates, each of the drains and each of the storage electrodes respectively have a drain opening and a storage electrode opening, and the drain openings and the storage electrode openings expose parts of the patterned semiconductor layer;
    forming a completely covering second insulating layer;
    patterning the second insulating layer and the first insulating layer to expose parts of the drain openings, parts of the storage electrode openings, parts of the data lines, parts of the data pads, parts of the gate lines, and parts of the gate pads;
    performing an etching process to selectively remove the exposed parts of the patterned metal multilayer; and
    forming a patterned conducting layer, wherein the patterned conducting layer includes a plurality of pixel electrodes electrically connected to the drains individually.

2. The method as claimed in claim 1, wherein the patterned semiconductor layer is formed on the first insulating layer corresponding to the top of the gates, on parts of the first insulating layer corresponding to the underside of the drains, and on parts of the first insulating layer corresponding to the underside of the storage electrodes.

3. The method as claimed in claim 1, wherein the data lines and the data pads are formed on the first insulating layer, and the data lines intersect the gate lines.

4. The method as claimed in claim 1, wherein the steps of forming the patterned semiconductor layer and forming the patterned metal multilayer comprise:
    forming a semiconductor layer on the first insulating layer;
    patterning the semiconductor layer to form the patterned semiconductor layer;
    forming a metal multilayer on the first insulating layer and the patterned semiconductor layer; and
    patterning the metal multilayer to form the patterned metal multilayer.

5. The method as claimed in claim 1, wherein the steps of forming the patterned semiconductor layer and forming the patterned metal multilayer comprise:
    forming a semiconductor layer and a metal multilayer sequentially on the first insulating layer; and
    patterning the semiconductor layer and the metal multilayer by a half-tone mask process, gray-tone mask process, or attenuated phase-shift mask process, thereby to form the patterned semiconductor layer and the patterned metal multilayer simultaneously.

6. The method as claimed in claim 1, wherein each of the storage electrodes is individually connected to each of the pixel electrodes.

7. The method as claimed in claim 1, wherein the patterned metal multilayer comprises a second metal layer and a third metal layer from top to bottom.

8. The method as claimed in claim 7, wherein the second metal layer is an aluminum layer, and the third metal layer is a titanium layer, a molybdenum layer, or an alloy layer thereof.

9. The method as claimed in claim 7, wherein the etching process uses wet or dry etching to remove parts of the exposed second metal layer to form under-cut structures.

10. The method as claimed in claim 1, wherein the patterned first metal layer comprises an upper metal layer and a lower metal layer.

11. The method as claimed in claim 10, wherein the upper metal layer is an aluminum layer, and the lower metal layer is a titanium layer, a molybdenum layer, or an alloy layer thereof.

12. The method as claimed in claim 10, wherein the etching process uses wet or dry etching to remove parts of the exposed upper metal layer to form under-cut structures.

13. The method as claimed in claim 1, wherein the positions of the storage electrodes partially overlap the positions of the gate lines as seen from top to bottom.

14. The method as claimed in claim 1, wherein the patterned first metal layer further comprises a plurality of common lines and a plurality of common pads connected with the common lines, wherein the positions of the storage electrodes partially overlap the positions of the common lines as seen from top to bottom.

15. The method as claimed in claim 1, wherein the etching process uses wet or dry etching to remove parts of the exposed first insulating layer to form under-cut structures.

* * * * *